US008269911B2

(12) United States Patent
Watanabe et al.

(10) Patent No.: US 8,269,911 B2
(45) Date of Patent: Sep. 18, 2012

(54) LIQUID CRYSTAL DISPLAY DEVICE

(75) Inventors: Saburo Watanabe, Ichinomiya (JP);
Hiroshi Tokuyama, Mobara (JP);
Norihisa Fukayama, Mobara (JP)

(73) Assignees: Hitachi Displays, Ltd., Chiba (JP);
Panasonic Liquid Crystal Display Co., Ltd., Hyogo-ken (JP)

( * ) Notice: Subject to any disclaimer, the term of this patent is extended or adjusted under 35 U.S.C. 154(b) by 97 days.

(21) Appl. No.: 12/255,115

(22) Filed: Oct. 21, 2008

(65) Prior Publication Data

US 2009/0109368 A1    Apr. 30, 2009

(30) Foreign Application Priority Data

Oct. 31, 2007  (JP) ................................. 2007-282624

(51) Int. Cl.
*G02F 1/1333* (2006.01)
(52) U.S. Cl. ........................................................ 349/58
(58) Field of Classification Search .................... 349/56, 349/58, 65
See application file for complete search history.

(56) References Cited

U.S. PATENT DOCUMENTS

| | | | | |
|---|---|---|---|---|
| 6,697,130 | B2 * | 2/2004 | Weindorf et al. | 349/65 |
| 7,217,990 | B2 * | 5/2007 | Chung | 257/668 |
| 2005/0024553 | A1 * | 2/2005 | Fukuta et al. | 349/58 |
| 2007/0263407 | A1 * | 11/2007 | Sakai | 362/608 |
| 2008/0303972 | A1 * | 12/2008 | Han et al. | 349/58 |

FOREIGN PATENT DOCUMENTS

| | | |
|---|---|---|
| JP | 64-088426 | 4/1989 |
| JP | 2004-279262 | 10/2004 |
| JP | 2005-077753 | 3/2005 |

* cited by examiner

*Primary Examiner* — Sarah Hahm
(74) *Attorney, Agent, or Firm* — Antonelli, Terry, Stout & Kraus, LLP.

(57) ABSTRACT

In a liquid crystal display device which uses light emitting diodes as a light source, the present invention provides a light source which can be effectively housed in a housing casing of a backlight even when an area of a printed circuit board is increased by taking radiation of heat from the light emitting diodes into consideration. A printed circuit board is formed by arranging light emitting diodes on a flexible substrate. The printed circuit board is formed with an area larger than an area of a light incident surface of a light guide plate, and is arranged to face the light incident surface of the light guide plate in an opposed manner. The light guide plate and the printed circuit board are housed in the inside of a housing casing, the printed circuit board is made foldable by forming slits in the printed circuit board thus enabling housing of the printed circuit board in the housing casing in a folded shape. Due to housing of the printed circuit board in a folded shape, a contact area of the printed circuit board with the housing casing is increased thus enhancing a heat radiation effect.

12 Claims, 10 Drawing Sheets

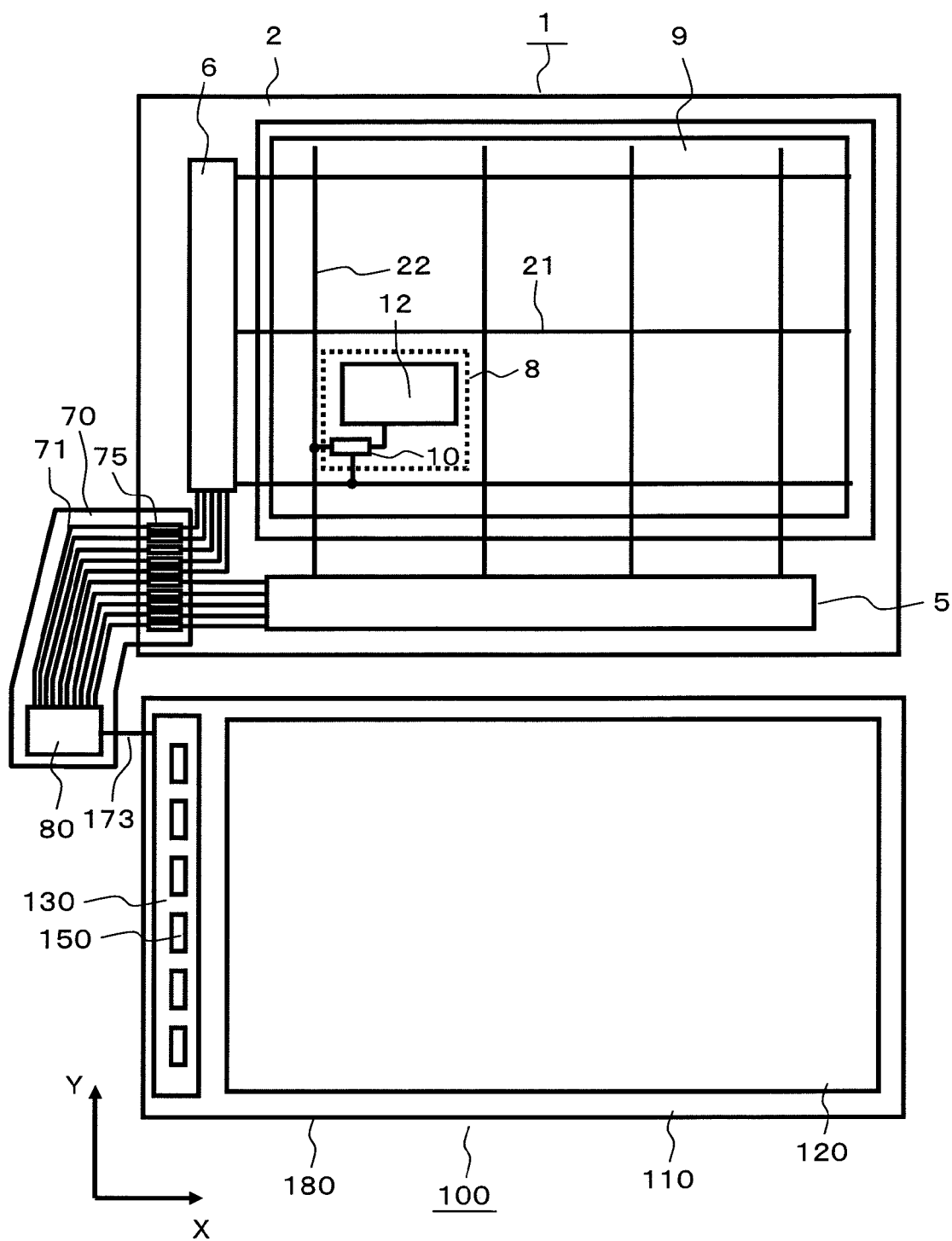

LIQUID CRYSTAL DISPLAY DEVICE

BACKGROUND OF THE INVENTION

1. Field of the Invention

The present invention relates to a light source of a non-self-luminous display device, and more particularly to a liquid crystal display device having a backlight which uses LEDs (light emitting diodes) as a light source.

2. Background Art

Recently, the liquid crystal display device has been popularly used as a display device. Particularly, the liquid crystal display device is used as a display part of portable equipment because the liquid crystal display device is thin and light-weighted and consumes small electric power.

However, the liquid crystal display device is not self-luminous and hence, the liquid crystal display device requires a lighting means. In general, as a lighting device of the liquid crystal display device, a planar lighting device referred to as a backlight is popularly used. Conventionally, although a cold cathode fluorescent tube has been used as a light emitting element (also referred to as a light source) of the backlight, a light emitting element which uses LEDs has been also recently used for a portable equipment.

A liquid crystal display device which uses LEDs as a light source has been proposed in JP-A-64-88426, for example. Further, the constitution of a backlight having a light guide plate which uses LEDs is also disclosed in JP-A-2005-077753.

SUMMARY OF THE INVENTION

In an attempt to realize the high brightness using a large number of LEDs, there arises a drawback that an operating temperature of a liquid crystal display device is elevated thus lowering light emitting efficiency. To overcome such a drawback, there has been proposed the constitution which intends to radiate heat by forming a printed circuit board using a metal plate or the like. However, the metal plate cannot be deformed flexibly and hence, a mode of mounting the metal plate is limited.

Further, in an attempt to realize a liquid crystal display device which exhibits high brightness, the number of light emitting elements is increased and, along with the increase of the number of the light emitting elements, the number of lines for supplying voltages to the light emitting elements is also increased so that an area of a printed circuit board in which the lines are formed is also increased.

The present invention has been made under such circumstances and it is an object of the present invention to realize, in a liquid crystal display device having a backlight which includes a large number of light emitting elements, a backlight which can house a printed circuit board efficiently with high reliability even when an area of the printed circuit board is increased.

A liquid crystal display device includes a liquid crystal panel, a backlight which radiates light to the liquid crystal panel, a plurality of light emitting elements mounted on the backlight, a printed circuit board on which the light emitting elements are arranged, a light guide plate on which light emitted from the light emitting elements is incident, and a housing casing which houses the printed circuit board and the light guide plate therein, wherein slits are formed in the printed circuit board to make the printed circuit board foldable, the printed circuit board is folded along a side wall of the housing casing so as to allow the printed circuit board to be in contact with a front surface and a back surface of the side wall.

In the liquid crystal display device of the present invention having the backlight which uses LEDs as the light emitting element by taking radiation of heat from the backlight into consideration, the printed circuit board with the increased area can be effectively housed in the backlight.

According to the present invention, in the liquid crystal display device which uses the LEDs as the light emitting element, it is possible to acquire the highly reliable LED light source. Further, it is also possible to effectively house the LED light source in the backlight.

BRIEF DESCRIPTION OF THE DRAWINGS

FIG. 1 is a block diagram showing the schematic constitution of a liquid crystal display device according to an embodiment of the present invention;

DESCRIPTION OF THE PREFERRED EMBODIMENT

Figure 2A:
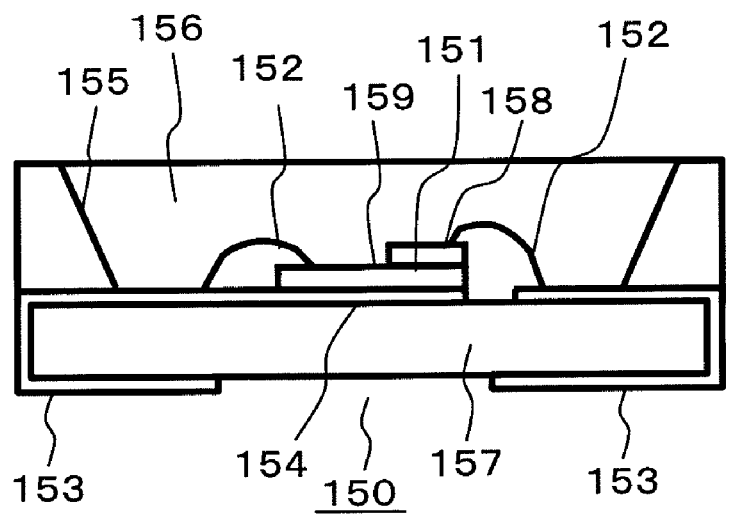
FIG. 2A and FIG. 2B are schematic views showing a light emitting diode of the liquid crystal display device according to the embodiment of the present invention.

A liquid crystal display device includes a liquid crystal panel and a backlight which radiates light to the liquid crystal panel. The backlight includes a light guide plate, a plate-shaped light source portion which is formed along one side of the light guide plate, and a housing casing which houses the light guide plate and the plate-shaped light source portion therein. The light guide plate includes a light incident surface on which light emitted from the plate-shaped light source portion is incident, a light radiation surface from which the light is radiated, and a bottom surface which faces the light radiation surface in an opposed manner. A thickness of the light guide plate between the light radiation surface and the bottom surface is set to a fixed value. The plate-shaped light source portion includes the light radiation surface on which the light emitting elements are mounted, and the light radiation surface is arranged to face the light incident surface of the light guide plate.

A width of the plate-shaped light source portion in the thickness direction of the light guide plate is set larger than a thickness of the light guide plate. To enable housing of the plate-shaped light source portion having a width larger than the thickness of the light guide plate, the plate-shaped light source portion is folded. Further, slits are formed in the plate-shaped light source portion to make the plate-shaped light source portion foldable.

FIG. 1 is a plan view showing a liquid crystal display device 100 of the present invention. The liquid crystal display device 100 is constituted of a liquid crystal panel 1, a backlight 110 which functions as a planar light source device, and a control circuit 80. Signals and power source voltages necessary for allowing the liquid crystal panel 1 to perform a display are supplied from the control circuit 80. The control circuit 80 is mounted on a flexible printed circuit board 70, and signals are transmitted to the liquid crystal panel 1 via lines 71 and terminals 75. Further, required voltages are supplied to the backlight 110 via lines 173.

The backlight 110 is constituted of a light guide plate 120, a light source 130 and a housing casing 180. The backlight 110 is provided for radiating light to the liquid crystal panel 1. The liquid crystal panel 1 performs a display by controlling a transmission quantity or a reflection quantity of light radiated from the backlight 110. Here, the backlight 110 is mounted on a back surface side or a front surface side of the liquid crystal panel 1 in an overlapped manner as viewed from a viewer. However, in FIG. 1, to facilitate the understanding of the constitution of the liquid crystal display device, the backlight 110 is shown in a juxtaposed manner with the liquid crystal panel 1. The backlight 110 is explained in detail later.

A pixel electrode 12 is formed in each pixel portion 8 of the liquid crystal panel 1. Although the liquid crystal panel 1 includes a large number of pixel portions 8 in a matrix array, to avoid the drawing from becoming cumbersome, in FIG. 1, only one pixel portion 8 is illustrated. The pixel portions 8 which are arranged in a matrix array form a display region 9, and the respective pixel portions 8 play the role of pixels of a display image, and an image is displayed on the display region 9.

The liquid crystal panel 1 is provided with gate signal lines (also referred to as scanning lines) 21 which extend in the x direction and are arranged parallel to each other in the y direction in the drawing and drain signal lines (also referred to as video signal lines) 22 which extend in the y direction and are arranged parallel to each other in the x direction in the drawing. The pixel portions 8 are formed in regions which are surrounded by the gate signal lines 21 and the drain signal lines 22.

A switching element 10 is provided to the pixel portion 8. A control signal is supplied to the switching element 10 from the gate signal lines 21 so as to control an ON/OFF state of the switching element 10. When the switching element 10 is turned on, the video signal which is transmitted via the drain signal line 22 is supplied to the pixel electrode 12.

The drain signal lines 22 are connected to a drive circuit 5, and video signals are outputted to the drain signal lines 22 from the drive circuit 5. The gate signal lines 21 are connected to a drive circuit 6, and control signals are outputted to the gate signal lines 21 from the drive circuit 6. Here, the gate signal lines 21, the drain signal lines 22, the drive circuit 5 and the drive circuit 6 are formed on the same TFT substrate 2.

Figure 2B:
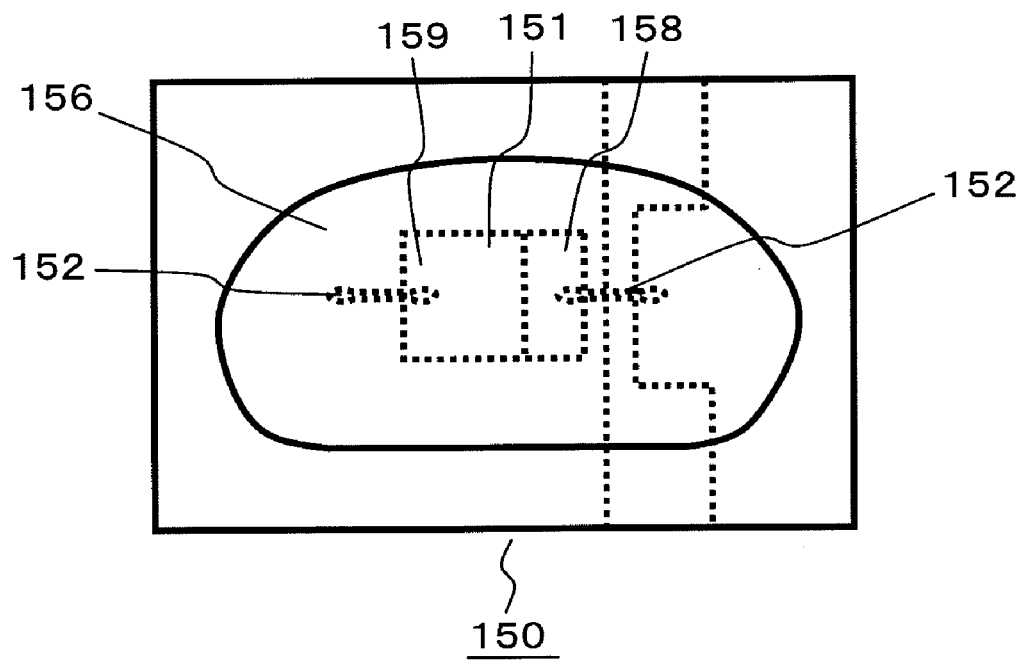

Next, FIG. 2A and FIG. 2B are schematic views showing an LED 150 which constitutes the light emitting element, wherein FIG. 2A is a schematic cross-sectional view of the LED 150, and FIG. 2B is a front view of the LED 150 as viewed from a light-emission side.

The LED 150 includes an LED chip 151 which constitutes a light emitting portion. The LED chips 151 are mounted on a chip mounting portion 154. The LED chip 151 has a pn junction, and light having a specific wavelength is radiated when a voltage is applied to the pn junction. A p electrode (anode) 158 is formed on a p-type semiconductor layer which forms the pn junction, and an n electrode (cathode) 159 is formed on an n-type semiconductor layer which forms the pn junction.

Wires 152 are connected to the p electrode 158 and the n electrode 159 respectively. With these wires 152, chip terminals 153 which are provided for connecting the LED 150 and the outside are electrically connected with the p electrode 158 and the n electrode 159 respectively.

A fluorescent light emitting portion 156 may be formed on the light radiation surface side of the LED chip 151. The fluorescent light emitting portion 156 has a function of converting a wavelength of light which is emitted from the LED chip 151. Here, numeral 155 indicates a cone-shaped reflection surface, and the cone-shaped reflection surface reflects light advancing in the lateral direction toward the light-radiation-surface side.

On a back-surface side of the LED chip 151, a chip substrate is mounted so as to fix and hold the chip mounting portion 154, the cone-shaped reflection surface 155, chip terminals 153 and the like.

The chip terminals 153 are connected with external lines or the like on a back surface of the chip substrate 157. Accordingly, the chip terminals 153 extend to the back-surface side of the chip substrate 157 from the light-radiation-surface side of the chip substrate 157 by way of side surfaces of the chip substrate 157. By forming the chip terminals 153 and the chip mounting portion 154 using metal which exhibits high optical reflectance, it is possible to make use of the chip mounting portion 154 as a light reflection surface. Further, by forming the chip terminals 153 and the chip mounting portion 154 using metal (a conductive material being also used) which exhibits high heat conductivity, it is possible to radiate heat generated by the LED chip 151 to a back surface side of the chip substrate 157.

Figure 3A:
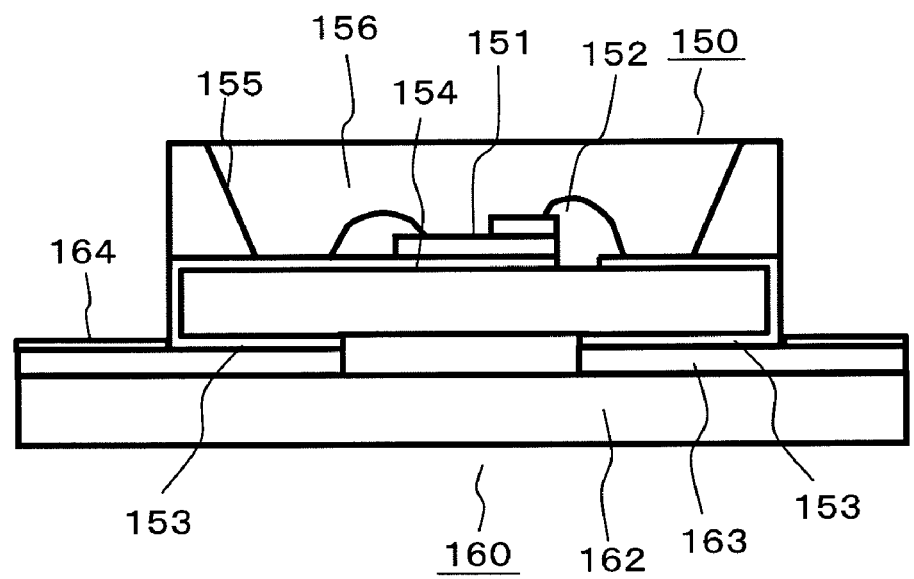
FIG. 3A and FIG. 3B are schematic views showing a state in which the light emitting diode of the liquid crystal display device according to the embodiment of the present invention is mounted on a printed circuit board.
Figure 3B:
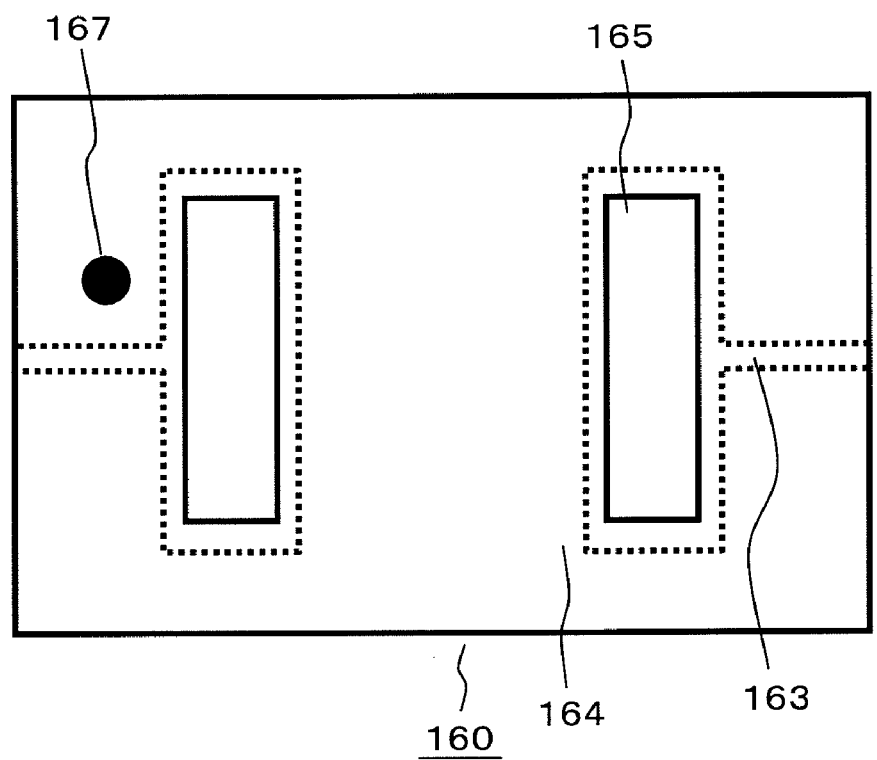

Next, the printed circuit board 160 on which the LED 150 is mounted is explained in conjunction with FIG. 3A and FIG. 3B. FIG. 3A is a schematic cross-sectional view showing a state in which the LED 150 is mounted on the printed circuit board 160. FIG. 3B is a schematic front view showing a portion of the printed circuit board 160 on which the LED 150 is mounted.

With respect to the printed circuit board 160, lines 163 formed of a conductive layer made of a copper foil or the like are formed on a base material 162 which exhibits flexibility. An insulation layer 164 is formed on the lines 163, opening portions are formed in the insulation layer 164 on the conductive layer, and connecting pads 165 are formed of the opening portions.

By forming the substrate of the printed circuit board 160 using a material which exhibits favorable heat conductivity, it is possible to effectively radiate heat which is transmitted to a back-surface side of the chip substrate 157. To increase the heat radiation efficiency, it is desirable to decrease a thickness of the insulation layer 164 provided that a problem such as short-circuiting or leaking of an electric current can be prevented. In this embodiment, the insulation layer 164 is formed of an insulation layer having a thickness of 0.12 mm and heat conductivity of 6.5 W/mK.

Chip terminals 153 of the LED 150 are electrically connected to the connecting pads 165 which are formed on end portions of the lines. As described above, the insulation layer 164 is formed on the front surface of the printed circuit board 160 by coating thus preventing the lines from being short-circuited with other constitutional components on a front-surface side of the printed circuit board 160 and ensuring insulation between the pads 165. To the pads 165, a solder paste or the like is applied by printing, and the LED 150 is mounted on the printed circuit board 160 using a reflow process or the like.

The LED 150 is mounted on the printed circuit board 160 using the solder-reflow process and hence, the insulation layer 164 is formed of a member which exhibits low affinity with the solder. However, since the insulation layer 164 is formed on the front surface of the printed circuit board 160, the insulation layer 164 is preferably formed of a member having achromatic color. Particularly, in view of the light utilization efficiency, the insulation layer 164 is preferably made of a white or whitish material so that the insulation layer 164 can reflect a large quantity of light. As a material which exhibits high reflectivity, titanium oxide or the like is preferably used. Here, numeral 167 indicates a mark for indicating a position of a cathode (or anode). For enhancing the visibility of the liquid crystal display device, color different from the color of the insulation layer 164 is used for forming the mark 167.

Figure 4A:
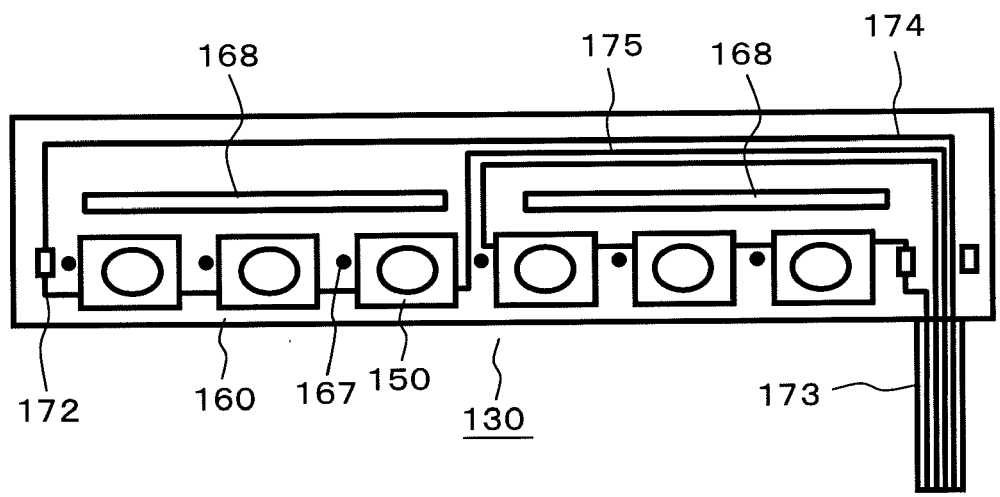
FIG. 4A to FIG. 4C are schematic views showing a printed circuit board of the liquid crystal display device according to the embodiment of the present invention.
Figure 4B:
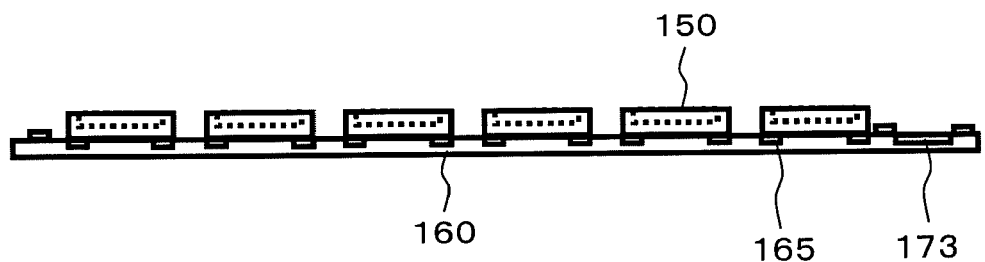
Figure 4C:
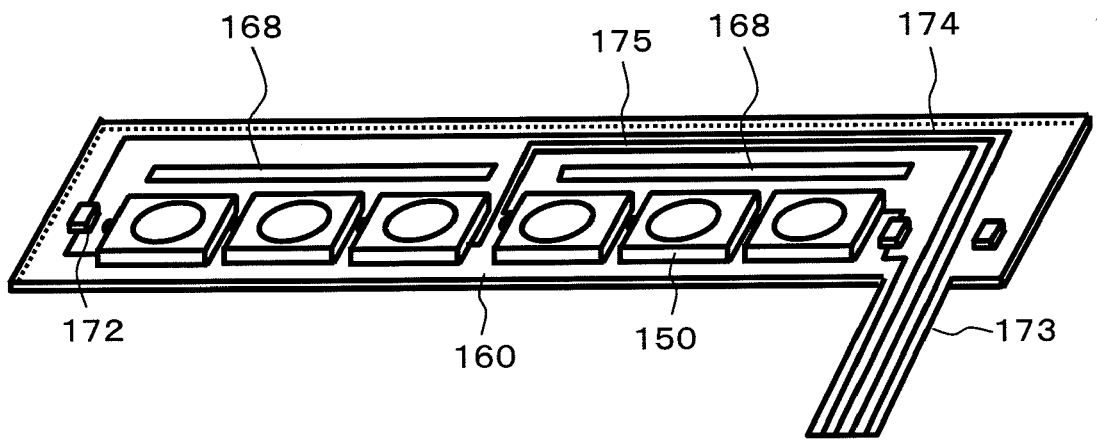

Next, FIG. 4A, FIG. 4B and FIG. 4C show a state in which the LEDs 150 are linearly mounted on the printed circuit board 160 thus forming a plate-shaped light source portion 130. FIG. 4A is a schematic front view of the plate-shaped light source portion 130, FIG. 4B is a schematic cross-sectional view of the plate-shaped light source portion 130, and FIG. 4C is a schematic perspective view of the plate-shaped light source portion 130.

In FIG. 4A to FIG. 4C, six LEDs 150 are arranged parallel to each other on the printed circuit board 160 so as to form the linear light source. The LED 150 generates a fixed voltage difference in the pn junction due to the characteristic of a diode. The voltage difference in the pn junction differs depending on a manufacturing process and hence, the LED 150 is adjusted so as to apply an optimum voltage to the pn junction. However, when n pieces of LEDs 150 are connected with each other in parallel, n pieces of adjustment circuits become necessary thus giving rise to a drawback that a manufacturing cost is pushed up due to the adjustment of the voltages.

In FIG. 4A to FIG. 4C, the LEDs 150 are connected in series with each other for every three LEDs 150, and the voltage is adjusted for every three LEDs 150. When a vehicle-mounting voltage 12V is used as a power source voltage and a potential difference generated between the respective LEDs 150 is approximately 4V, it is possible to efficiently apply the voltage to the LEDs 150 by connecting the LEDs 150 in series for every three LEDs 150. That is, assuming the relationship among the power source voltage V, the potential difference Vd generated in the average LED 150, and the number n of the LEDs 150 as $V \geq n \times Vd$, it is possible to efficiently apply the voltage to the LEDs 150. Here, when the potential difference generated in the respective LEDs 150 is approximately 3V and the power source voltage is 12V, it is possible to efficiently apply the voltage to the LEDs 150 by connecting the LEDs 150 in series for every four LEDs 150. Further, when the voltage adjustment is performed by inserting a resistance 172 between the last LED 150 out of n pieces of LEDs 150 which are connected with each other in series and a ground potential, two lines, that is, a voltage-supply-use line 174 and a return-use line 175 become necessary for every serial connection. In this embodiment, four lines become necessary, and the respective lines are connected to an external connection line 173.

As shown in FIG. 4C, the lines 174, 175 are formed on the printed circuit board 160. When the number of LEDs 150 is increased, an area on which the lines 174, 175 are formed is also increased. In the drawing, a wiring portion is arranged above the LEDs 150, and the lines 174, 175 the number of which corresponds to the number of LEDs 150 are arranged in the wiring portion. Further, electric elements such as resistances and capacitances necessary for the circuit are also arranged on the printed circuit board 160.

Due to such constitution, there exists a tendency that an area of the printed circuit board 160 is increased. However, a space for forming the printed circuit board 160 is limited and hence, the increase of the area of the printed circuit board 160 has been a problem to be solved in miniaturizing the backlight.

To overcome this problem caused by the increase of the area of the printed circuit board 160, according to this embodiment, slits 168 are formed in the printed circuit board 160. By forming the slits 168 in the printed circuit board 160, it is possible to fold the printed circuit board 160 using the slits 168 as a folding line. Due to such constitution, even when a width W of the printed circuit board 160 is set larger than a thickness D of the light guide plate at the light incident surface of the light guide plate 120, by folding the printed circuit board 160, it is possible to set a width of a surface of the printed circuit board 160 which faces the light incident surface of the light guide plate 120 smaller than the thickness of the light guide plate at the light incident surface of the light guide plate 120.

Figure 5:
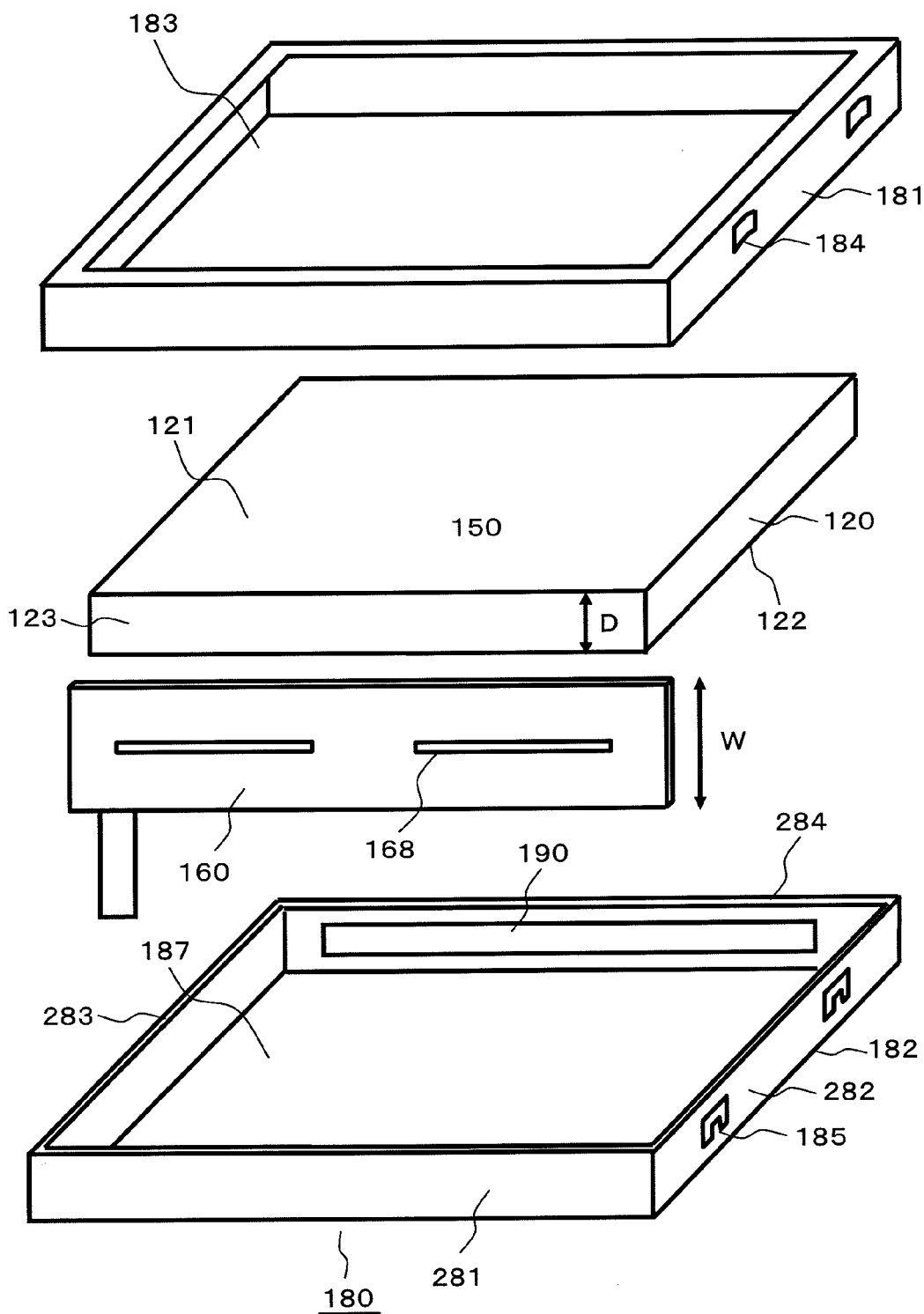
FIG. 5 is a schematic view showing the structure of a backlight of the liquid crystal display device according to the embodiment of the present invention.

Next, a housing casing 180 for housing the light guide plate 120 and the printed circuit board 160 therein is explained in conjunction with FIG. 5. The housing casing 180 is made of metal or the like and is formed into a box shape which allows the housing casing 180 to house the light guide plate 120 therein. The housing casing 180 is configured to house the light guide plate 120 in a state that the housing casing 180 sandwiches the light guide plate 120 from above and below.

The light guide plate 120 has a light radiation surface 121 and a bottom surface 122. The light guide plate 120 also includes a light incident surface 123 which is arranged to face the printed circuit board 160. Light emitted from the LED 150 (not shown in the drawing) enters the inside of the light guide plate 120 from the light incident surface 123. A fixed distance is defined between the light radiation surface 121 and the bottom surface 122. Light propagates in the inside of the light guide plate 120 while repeating the total reflection between the light radiation surface 121 and the bottom surface 122.

Numeral 181 indicates an upper casing, and an opening 183 is formed in the upper casing 181 for radiating light therethrough. The opening 183 is formed so as to guide the light radiated from the light guide plate 120 to the liquid crystal panel. A portion of the light which propagates in the inside of the light guide plate 120 makes an angle which allows the radiation of light with respect to the light radiation surface 121, and such light which makes the angle allowing the radiation of light is radiated from the light radiation surface 121. The light radiated from the light radiation surface 121 enters the liquid crystal panel via the opening 183. Numeral 184 indicates engaging portions, and the upper casing 181 and a lower casing 182 are fixed to each other due to the engagement of the engaging portions 184 and engaging portions 185.

Numeral 182 indicates the lower casing, and the lower casing 182 defines a housing portion 187 in which the printed circuit board 160 and the light guide plate 120 are housed. Further, the lower casing 182 includes side walls 281, 282, 283, 284 having a height substantially equal to the thickness D of the light guide plate 120. In FIG. 5, the width W of the printed circuit board 160 is set larger than the thickness D of the light guide plate 120 and hence, the printed circuit board 160 projects from the housing portion 187.

Here, a cushion material 190 is provided between the side wall 284 of the lower casing 182 and the light guide plate 120 so as to prevent the movement or the rupture of the light guide plate 120 due to vibrations or the like.

Figure 6:
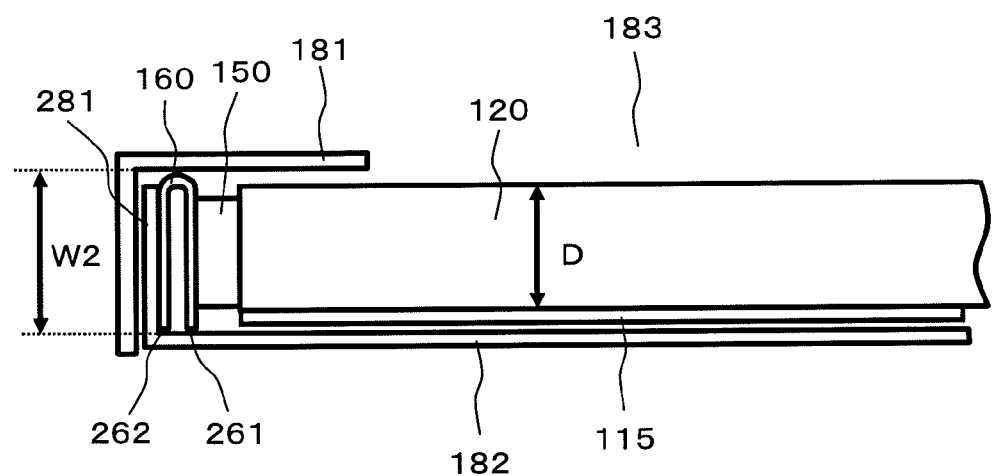
FIG. 6 is a schematic cross-sectional view showing the structure of the backlight of the liquid crystal display device according to the embodiment of the present invention.

Next, FIG. 6 shows a state in which the printed circuit board 160 is housed in a folded shape. In FIG. 6, the LEDs 150 are arranged on a lower side of the printed circuit board 160, and the light incident surface 123 of the light guide plate 120 and the LEDs 150 are arranged to face each other. A width of the LED 150 is substantially equal to or larger than the width of the light incident surface 123. Accordingly, a light radiation portion 261 on which the LEDs 150 are mounted is arranged to face the light incident surface 123. Further, the wiring portion 262 on which lines are formed is arranged remote from the light incident surface 123. Accordingly, the width of the printed circuit board 160 is set larger than the width of the light incident surface 123.

The width of the printed circuit board 160 is set large and hence, the printed circuit board 160 is folded such that the light radiation portion 261 and the wiring portion 262 overlap with each other, and the folded printed circuit board 160 is housed in a space defined between the upper casing 181 and the lower casing 182 having a width W2. Further, a portion of the folded printed circuit board 160 is brought into contact with the side wall 281 of the lower casing 182 for radiation of heat.

Here, the LED 150 and the side wall 281 of the lower casing 182 are spaced apart from each other and hence, heat generated by the LEDs 150 is hardly transmitted to the side wall 281 thus giving rise to a drawback that a temperature of back-surface portions of the LEDs 150 is elevated. Here, numeral 115 indicates a reflection sheet, and the reflection sheet 115 reflects the light radiated from the light guide plate 120 toward a side where the opening 183 is formed.

As previously described in conjunction with FIG. 2, the LEDs 150 emit light when a voltage is applied to the pn junction, and a temperature of the pn junction portion becomes high when the light is emitted. Further, the thermal resistance of the LED 150 takes an intrinsic value depending on the structure of an individual element. Accordingly, to adopt a temperature of the insulation layer 164 of the printed circuit board 160 on which LEDs 150 are mounted as the reference, a temperature of the pn junction portion (hereinafter, referred to as a junction temperature Tj) is considered as a temperature obtained by adding a fixed value to the temperature of the insulation layer 164.

For example, assuming thermal resistance between the pn junction of the LED 150 and the insulation layer 164 as 45° C./W, when 0.5 W is supplied to the LED 150 and the temperature of the insulation layer 164 is Ts, the junction temperature Tj becomes Ts+22.5° C.

As has been explained above, to take the presence of the intrinsic thermal resistance between the pn junction and the insulation layer 164 into consideration, it is considered that when heat is not efficiently radiated from the printed circuit board 160 so that the temperature of the insulation layer 164 is increased, the junction temperature Tj is also increased. When the junction temperature Tj becomes high at the time of operating the LEDs 150, a lifetime of the LEDs 150 is adversely affected thus lowering the reliability of a product.

Accordingly, it is preferable that the printed circuit board 160 adopts the constitution which exhibits the high heat radiation efficiency as much as possible. Accordingly, the printed circuit board 160 is configured such that even when the printed circuit board 160 is folded, a distance between the LEDs 150 and the lower casing 182 is decreased and, at the same time, a contact area between the lower casing 182 and the printed circuit board 160 is increased.

Figure 7:
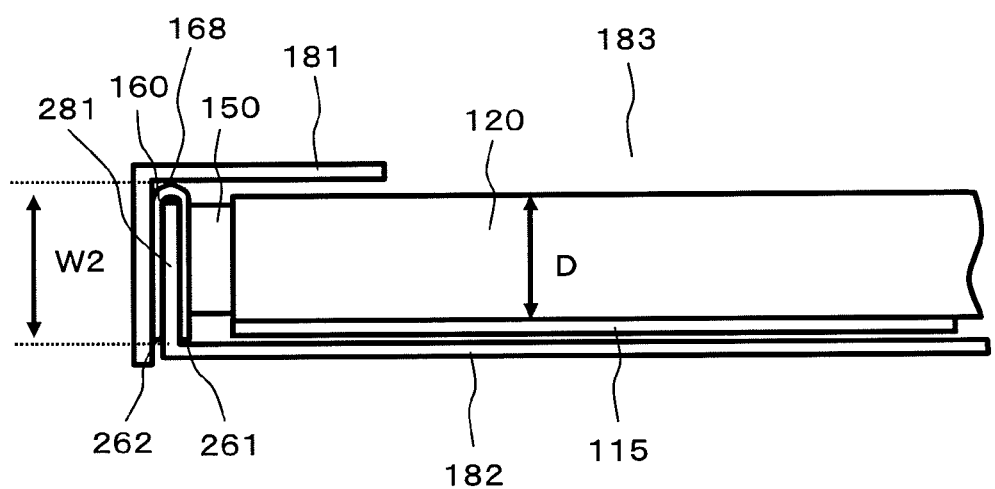
FIG. 7 is a schematic cross-sectional view showing the structure of the backlight of the liquid crystal display device according to the embodiment of the present invention.

FIG. 7 shows the constitution of the printed circuit board 160 which brings the folded printed circuit board 160 into contact with a front surface and a back surface of the side wall 281 of the lower casing 182. That is, the printed circuit board 160 is arranged such that the printed circuit board 160 is folded and gets over an upper end of the side wall 281. The printed circuit board 160 which constitutes back surface portions of the LEDs 150 is also brought into contact with one surface of the side wall 281 so as to arrange the LEDs 150 and the lower casing 182 close to each other.

Further, by folding the printed circuit board 160, the light radiation portion 261 is brought into contact with one surface of the side wall 281, and the wiring portion 262 is also brought into contact with another surface of the side wall 281. That is, the printed circuit board 160 is brought into contact with two surfaces consisting of the front and back surfaces of the side wall 281 and hence, the contact area between the lower casing 182 and the printed circuit board 160 is increased. Here, the printed circuit board 160 is folded in a state that the printed circuit board 160 gets over an upper end of the side wall 281 and hence, the slits 168 are positioned in the vicinity of the upper end of the side wall 281.

Figure 8:
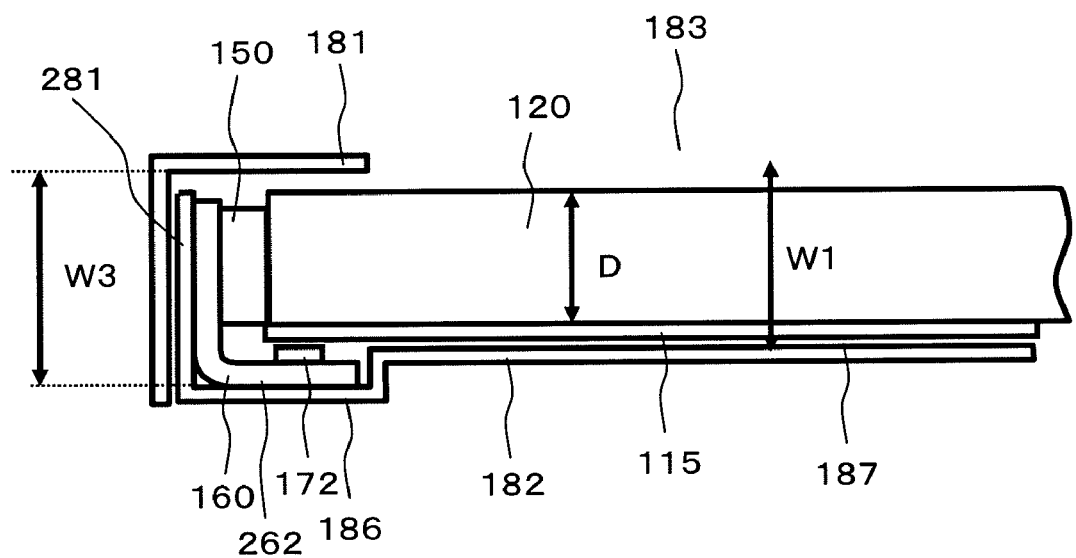
FIG. 8 is a schematic cross-sectional view showing the structure of the backlight of the liquid crystal display device according to the embodiment of the present invention.

Next, FIG. 8 shows the constitution of the printed circuit board 160 which bends a lower side thereof. In FIG. 8, the LEDs 150 are arranged on an upper side of the printed circuit board 160, and the wiring portion 262 which constitutes the lower side of the printed circuit board 160 is bent by 90 degrees along the lower casing 182. To house the bent printed circuit board 160, the lower casing 182 includes a printed circuit board housing portion 186 which bulges downwardly.

Accordingly, a width W3 of the lower casing 182 on which the side wall 281 is provided is set larger than a width W1 of the housing portion 187. Here, for easing the bending of the printed circuit board 160, slits 186 are formed in the printed circuit board 160. Further, it is also possible to house a circuit element such as a resistor 172 in the printed circuit board housing portion 186. In the constitution shown in FIG. 8, it is unnecessary to fold the printed circuit board 160 by an angle close to 180 degrees and hence, the constitution shown in FIG. 8 is suitable for the printed circuit board 160 having a relatively large thickness which makes the printed circuit board 160 difficult to fold.

As shown in FIG. 3, the insulation layer 164 is formed on a front surface of the printed circuit board 160 on a light-guide-plate-120-side. The printed circuit board 160 is arranged along a bottom surface of the light guide plate 120. Accordingly, by forming the insulation layer 164 which contains a white material or the like having high reflectance, it is possible to make light radiated from the light guide plate 120 reflected on the insulation layer 164 thus allowing the light to return to the light guide plate 120 again.

Figure 9:
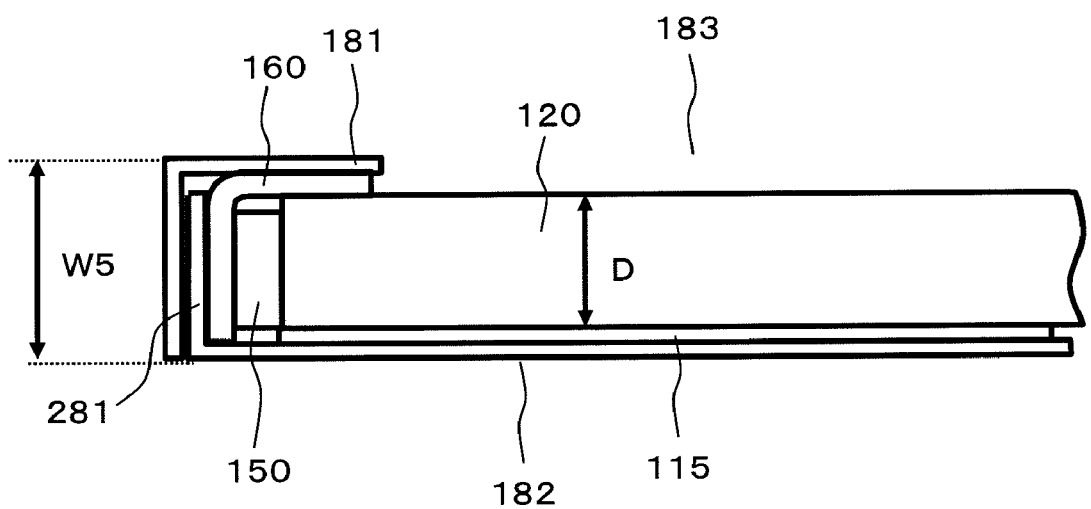
FIG. 9 is a schematic cross-sectional view showing the structure of the backlight of the liquid crystal display device according to the embodiment of the present invention.

Next, FIG. 9 shows the constitution of the printed circuit board 160 which bends the upper side of the printed circuit board 160. In FIG. 9, by increasing a width W5 of the side wall of the upper casing 181, the printed circuit board 160 can be housed in a bent shape. Also with respect to the printed circuit board 160 which bends an upper side thereof, with the use of the insulation layer 164 which contains a white material or the like having high reflectance, it is possible to make the light radiated from the light guide plate 120 reflected on the insulation layer 164 thus allowing the light to return to the light guide plate 120 again.

Figure 10:
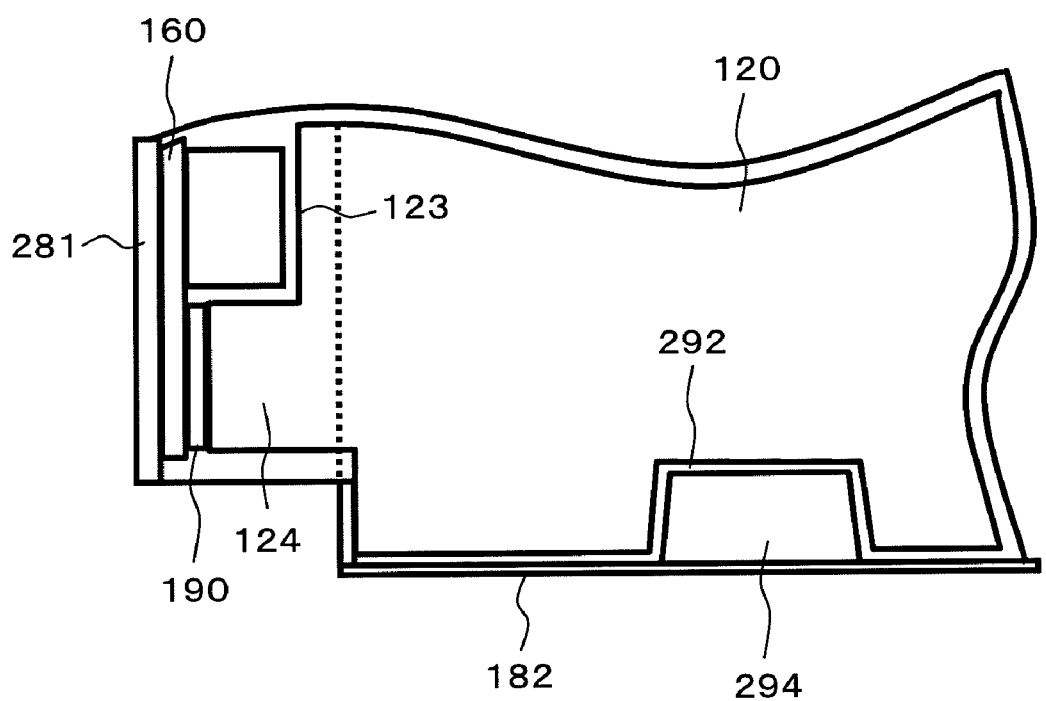
FIG. 10 is a schematic plan view showing the structure of the backlight of the liquid crystal display device according to the embodiment of the present invention.

Next, FIG. 10 shows a method of fixing the light guide plate 120. When a distance between the light incident surface 123 of the light guide plate 120 and the LEDs 150 is changed, there arises a drawback that an incident light quantity (light-incident rate) is changed. In view of such a drawback, it is necessary to prevent the distance between the light incident surface 123 and the LEDs 150 from being easily changed due to vibrations or the like. For this end, a fixing projection 294 is formed on the lower casing 182. The fixing projection 294 is fitted in a recessed portion 292 formed in the light guide plate 120 thus fixing the light guide plate 120.

The light guide plate 120 is fixed to the lower casing 182 by the fixing projection 294 and hence, it is possible to arrange the LEDs 150 and the light incident surface 123 with a distance which allows the LEDs 150 and the light incident surface 123 to be almost in contact with each other. However, inventors of the present invention found the followings. Conventionally, there exists no problem even when the light incident surface 123 and the LEDs 150 are brought into contact with each other. However, with the increase of an area of the light guide plate 120, there arise drawbacks that the LEDs 150 are broken or the light guide plate 120 is deformed due to compression of the LEDs 150 generated by thermal expansion or a dead weight of the light guide plate 120.

On the other hand, when the large distance is ensured between the light incident surface 123 and the LEDs 150 for enhancing the reliability, there arises a drawback that the light-incident rate is lowered.

Accordingly, in the constitution shown in FIG. 10, projecting portions 124 are formed on both ends of the light incident surface 123, and a cushion material 190 is sandwiched between the projecting portion 124 and the printed circuit board 160. Further, cushion materials 190 are also sandwiched between the respective side surfaces of the light guide plate 120 and the housing casing 180.

FIG. 10 which is an enlarged view shows the vicinity of the projecting portion 124 of the light guide plate 120. The cushion material 190 is mounted on a printed-circuit-board-160 side of the projecting portion 124. With the use of the cushion material 190, it is possible to prevent the printed circuit board from being broken by the projecting portion 124. Further, the distance between the light incident surface 123 and the LEDs can be held at a fixed value with the use of the projecting portions 124. Here, by selecting a white or whitish color which exhibits high reflectance as a color of the cushion material 190, it is possible to prevent leaking of light of the LEDs 150.

Figure 11:
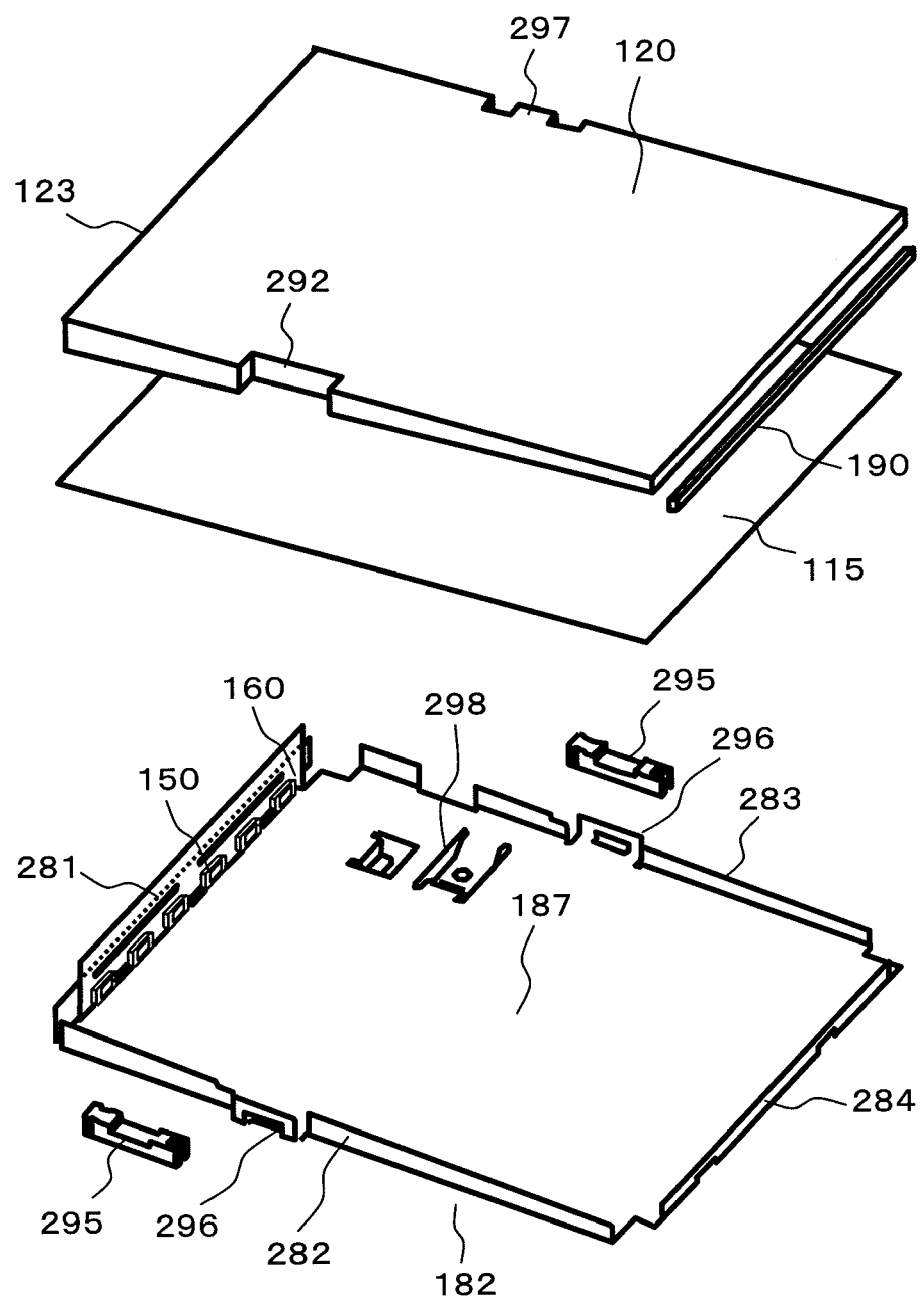
FIG. 11 is a schematic perspective view showing the structure of the backlight of the liquid crystal display device according to the embodiment of the present invention.

Next, FIG. 11 shows the constitution which mounts resin-made fixing members on a lower casing 182. The printed circuit board 160 is adhered to a first side wall 281 of the lower casing 182 in a folded shape. Further, mounting portions 296 are formed on a second side wall 282 and a third side wall 283 respectively, and fixing resin members 295 can be mounted on the mounting portions 296.

FIG. 11 shows a state of the printed circuit board 160 before the printed circuit board 160 is folded. Further, for facilitating the understanding of the constitution, the fixing resin members 295 are shown in a state that the fixing resin members 295 are removed from the mounting portions 296.

In FIG. 11, the fixing resin members 295 are mounted on the lower casing 182. A fixing recessed portion 292 or a fixing concave/convex portion 297 is formed in the light guide plate 120, and the fixing resin members 295 are engaged with the fixing recessed portion 292 or the fixing concave/convex portion 297 by fitting engagement so as to fix the light guide plate 120 to the lower casing 182.

There is no difference in hardness between the light guide plate 120 and the fixing resin member 295 and hence, even when a force is applied to the light guide plate 120 from the fixing resin member 295, there is no possibility that the light guide plate 120 is easily damaged by the fixing resin member 295.

Here, numeral 298 indicates a printed-control-circuit-board holding portion which can hold and fix a printed control circuit board of the liquid crystal display device to a back side of the housing portion 187.

As described above, when the distance between the light incident surface 123 of the light guide plate 120 and the LED 150 is changed, there arises a drawback that a quantity of incident light (a light incident ratio) is changed. Accordingly, it is necessary to prevent the distance between the light incident surface 123 and the LED 150 from being easily changed due to the thermal expansion, the vibrations or the like. The fixing resin members 295 are provided for preventing the light guide plate 120 from being moved toward the LED 150.

That is, by adhering the printed circuit board 160 to the first side wall 281 in a folded shape, the lower casing 182 and the printed circuit board 160 can be integrally formed with each other whereby the heat radiation efficiency can be enhanced. However, since the lower casing 182 and the printed circuit board 160 are integrally formed with each other, when the position of the lower casing 182 relative to the light guide plate 120 is changed, the distance between the printed circuit board 160 and the light guide plate 120 is changed whereby there arises a drawback that optical quality is lowered.

In FIG. 11, the fixing resin member 295 is mounted on the second side wall 282 or the third side wall 283 which are formed so as to intersect the first side wall 281. Accordingly, the movement of the light guide plate 120 toward the first side wall 281 is restricted by the fixing resin member 295.

Figure 12:
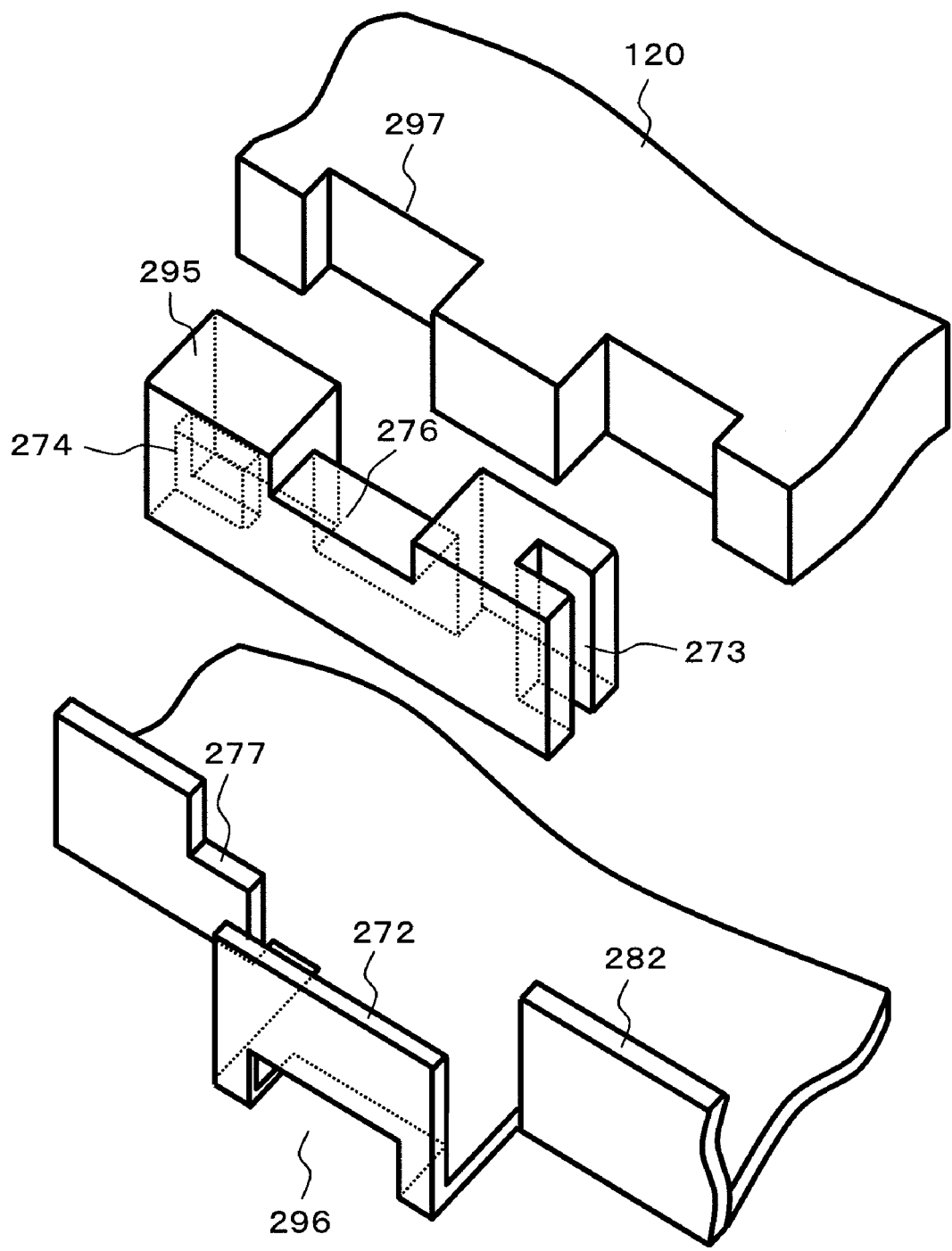
FIG. 12 is a schematic perspective view showing the holding structure of the backlight of the liquid crystal display device according to the embodiment of the present invention.

Next, FIG. 12 shows a state in which the fixing resin members 295 is mounted on the second side surface 282. The groove 273 is formed in the fixing resin member 295, and a portion of the second side wall 282 is fitted in the groove 273. Further, a groove 274 is formed in another end portion of the fixing resin members 295, and a portion of the second side wall 282 is fitted in the groove 274. The groove 274 is stopped at a middle portion of another end portion thus having a shape different from a shape of the groove 273. The shapes of the groove 273 and the groove 274 are made different from each other for preventing erroneous mounting (mounting direction) of the fixing resin member 295.

To allow fitting of the fixing resin member 295 fixed to the mounting portion 296 in the light guide plate 120, a fixing concave/convex portion 297 is formed in the light guide plate 120. By engaging the fixing concave/convex portion 297 with the fixing resin portion 295 by fitting engagement, the light guide plate 120 is fixed to the lower casing 182.

A holding plate 272 is arranged outside the mounting portion 296. The holding plate 272 restricts the movement of the fixing resin member 295 toward the outside and, at the same time, plays a role of protecting the fixing resin member 295.

An optical sheet holding groove 276 is formed in an upper surface of the fixing resin member 295 thus allowing the fixing resin member 295 to hold an optical sheet mounted on the light guide plate 120.

Further, by adopting black as color of the fixing resin member 295, it is also possible to prevent the reflection of undesired light. Here, for adjusting a quantity of light radiated from the vicinity of the fixing resin member 295, the fixing resin member 295 may have achromatic color or specific color.

The mounting portion 296 is formed on a portion of the second sidewall 282 or the third side wall 283, and is integrally formed with the lower casing 182 made of metal. As described previously, the groove 273 and the groove 274 are formed in the fixing resin member 295. By fitting portions of the side wall in the grooves 273, 274, the fixing resin member 295 is fixed. Here, the groove 274 does not penetrate the fixing resin member 295 from below to above and is closed at a middle portion of the fixing resin member 295. Accordingly, a cutout portion 277 is formed in the portion of the side wall corresponding to the groove 274.

The light guide plate 120 is fixed by the fixing resin member 295 and hence, the light guide plate 120 is not brought into contact with the lower casing 182 whereby it is possible to prevent the light guide plate 120 from being damaged by the metal-made lower casing 182.

What is claimed is:

1. A liquid crystal display device comprising:
a display panel;
a backlight which radiates light to the display panel;
a plurality of light emitting elements mounted on the backlight;
a printed circuit board on which the light emitting elements and wiring are arranged, the wiring being electrically connected with the light emitting elements;
a light guide plate on which light emitted from the light emitting elements is incident; and
a housing casing which houses the light guide plate therein, the housing casing having a side wall, wherein
a surface of the printed circuit board on which the light emitting elements are mounted is arranged to face a light incident surface of the light guide plate in an opposed manner,
a width of the printed circuit board is set larger than a thickness of the light incident surface of the light guide plate,
slits are formed in the printed circuit board to make the printed circuit board foldable;
the housing casing has a side wall which is formed along the light incident surface of the light guide plate; and
the printed circuit board is folded so as to face the light incident surface of the light guide plate and to contact with a front surface and a back surface of the side wall.

2. A liquid crystal display device according to claim 1, wherein the light emitting element is an LED.

3. A liquid crystal display device according to claim 1, wherein the printed circuit board has a front surface which exhibits high reflectance.

4. A liquid crystal display device according to claim 1, wherein the housing casing is made of metal, and the printed circuit board is folded so that the light emitting elements and the wiring arranged on the printed circuit board overlap one another.

5. A liquid crystal display device comprising:
a liquid crystal panel;
a planar light source device which radiates light to the liquid crystal panel;
light emitting diodes which are arranged linearly in the inside of the planar light source device;
a printed circuit board which electrically connects the light emitting diodes with each other by a wiring;
a light guide plate which has an incident surface on which light emitted from the light emitting diodes is incident; and
a housing portion which houses the light guide plate therein, wherein
the printed circuit board is arranged to face the light incident surface of the light guide plate in an opposed manner,
a width of the printed circuit board is set larger than a thickness of the light incident surface of the light guide plate,
the housing portion has a side wall which is formed along the light incident surface of the light guide plate, and
the printed circuit board is folded so as to be in contact with a front surface and a back surface of the side wall so that the light emitting diodes and the wiring are overlap one another.

6. A liquid crystal display device according to claim 5, wherein slits are formed in the printed circuit board to make the printed circuit board foldable.

7. A liquid crystal display device according to claim 5, wherein the printed circuit board has a front surface which exhibits high reflectance.

8. A liquid crystal display device according to claim 6, wherein the slits of the printed circuit board are positioned at an end portion of the side wall of the housing portion.

9. A liquid crystal display device comprising:
a liquid crystal panel; and
a backlight which radiates light to the liquid crystal panel, wherein
the backlight includes a light guide plate and a plate-shaped light source portion which is formed along a light incident surface of the light guide plate,
a housing casing which houses the light guide plate therein,
the housing casing has a side wall which is formed along the light incident surface of the light guide plate,
the plate-shaped light source portion includes a light radiation surface on which light emitting diodes are mounted, and a wiring portion which is electrically connected with the light emitting diodes,
a width of the plate-shaped light source portion is set larger than a thickness of the light guide plate, a reflective sheet is formed below the light guide plate,
the plate-shaped light source portion is folded, and
the light emitting diodes overlap the wiring portion and the side wall of the housing casing, and
the wiring portion contacts with a front surface and a back surface of the side wall.

10. A liquid crystal display device according to claim 9, wherein the light emitting diodes are arranged linearly.

11. A liquid crystal display device according to claim 9, wherein the light guide plate is housed in a housing casing and a cushion material is provided between the housing casing and the light guide plate.

12. A liquid crystal display device according to claim 9, wherein slits are formed in the plate-shaped light source portion to make the plate-shaped light source portion foldable.

* * * * *